US011727556B2

(12) United States Patent
Gu et al.

(10) Patent No.: US 11,727,556 B2
(45) Date of Patent: Aug. 15, 2023

(54) DEFECT DETECTION FOR MULTI-DIE MASKS

(71) Applicant: KLA Corporation, Milpitas, CA (US)

(72) Inventors: Wenfei Gu, Milpitas, CA (US);
Pei-Chun Chiang, Cupertino, CA (US);
Weston Sousa, San Jose, CA (US)

(73) Assignee: KLA Corp., Milpitas, CA (US)

( * ) Notice: Subject to any disclaimer, the term of this patent is extended or adjusted under 35 U.S.C. 154(b) by 118 days.

(21) Appl. No.: 17/489,665

(22) Filed: Sep. 29, 2021

(65) Prior Publication Data

US 2023/0098730 A1 Mar. 30, 2023

(51) Int. Cl.
| | |
|---|---|
| *G06K 9/00* | (2022.01) |
| *G06T 7/00* | (2017.01) |
| *G06T 7/80* | (2017.01) |
| *G03F 7/00* | (2006.01) |
| *G06F 16/50* | (2019.01) |
| *G03F 1/84* | (2012.01) |

(52) U.S. Cl.
CPC ............... *G06T 7/001* (2013.01); *G03F 1/84* (2013.01); *G03F 7/7065* (2013.01); *G06F 16/50* (2019.01); *G06T 7/0006* (2013.01); *G06T 7/80* (2017.01); *G06T 2207/30148* (2013.01)

(58) Field of Classification Search
CPC ......... G06T 7/001; G06T 7/0006; G06T 7/80; G06T 2207/30148; G03F 1/84; G03F 7/7065; G06F 16/50
See application file for complete search history.

(56) References Cited

U.S. PATENT DOCUMENTS

| | | |
|---|---|---|
| 6,614,520 B1 | 9/2003 | Bareket et al. |
| 7,570,796 B2 | 8/2009 | Zafar et al. |
| 7,676,077 B2 | 3/2010 | Kulkarni et al. |
| (Continued) | | |

FOREIGN PATENT DOCUMENTS

| | | |
|---|---|---|
| JP | 3967327 | 8/2007 |
| KR | 10-2270496 | 6/2021 |

OTHER PUBLICATIONS

Clifford et al., "Compensation methods using a new model for buried defects in extreme ultraviolet lithography masks," Photomask Technology 2010, Proceedings of SPIE vol. 7823, 78230V, Sep. 24, 2010, 10 pages.

(Continued)

*Primary Examiner* — Samir A Ahmed
(74) *Attorney, Agent, or Firm* — Ann Marie Mewherter

(57) ABSTRACT

Methods and systems for detecting defects on a mask are provided. One method includes generating a database reference image for a multi-die mask by simulation and detecting first defects on the mask by comparing the database reference image to images of the mask generated by an imaging subsystem for a first of the multiple dies. The method also includes generating a die reference image for the first of the multiple dies by applying one or more parameters of the imaging subsystem learned by generating the database reference image to the images generated by the imaging subsystem of one or more of the multiple dies other than the first multiple die. In addition, the method includes detecting second defects on the mask by comparing the die reference image to the images of the mask generated by the imaging subsystem for the first of the multiple dies.

23 Claims, 5 Drawing Sheets

(56) References Cited

U.S. PATENT DOCUMENTS

| | | | |
|---|---|---|---|
| 7,873,204 B2 | 1/2011 | Wihl et al. | |
| 8,126,255 B2 | 2/2012 | Bhaskar et al. | |
| 8,245,161 B1* | 8/2012 | Tortonese | G03F 1/68 |
| | | | 716/51 |
| 8,664,594 B1 | 4/2014 | Jiang et al. | |
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 9,002,497 B2 | 4/2015 | Marella et al. | |
| 9,222,895 B2 | 12/2015 | Duffy et al. | |
| 9,478,019 B2 | 10/2016 | Sezginer et al. | |
| 2013/0094752 A1 | 4/2013 | Tsuchiya et al. | |
| 2013/0236083 A1* | 9/2013 | Wang | G06T 7/001 |
| | | | 382/144 |
| 2013/0336574 A1* | 12/2013 | Nasser-Ghodsi | G06T 7/001 |
| | | | 382/145 |
| 2014/0168418 A1 | 6/2014 | Hess et al. | |
| 2015/0144798 A1* | 5/2015 | Shi | G03F 1/70 |
| | | | 250/372 |
| 2015/0276617 A1 | 10/2015 | Hess et al. | |
| 2018/0107928 A1 | 4/2018 | Zhang et al. | |
| 2019/0066292 A1* | 2/2019 | Pomeranz | G06T 7/0004 |
| 2019/0073568 A1 | 3/2019 | He et al. | |
| 2019/0244844 A1* | 8/2019 | Takeda | H04N 23/56 |
| 2020/0004138 A1 | 1/2020 | Budach et al. | |
| 2020/0096862 A1 | 3/2020 | Tolani et al. | |

OTHER PUBLICATIONS

Verduijn et al., "Printability and actinic AIMS review of programmed mask blank defects," SPIE Proceedings vol. 10143, Extreme Ultraviolet (EUV) Lithography VIII, 101430K, Mar. 24, 2017, 13 pages.

Deep et al., "ILT based defect simulation of inspection images accurately predicts mask defect printability on wafer," Photomask Japan 2016: XXIII Symposium on Photomask and Next-Generation Lithography Mask Technology, Edited by Nobuyuki, Yoshioka, Yokohama, Proc. of SPIE, 2016, vol. 9984, pp. 99840C-1-998400-9.

International Search Report and Written Opinion for PCT/US2022/044305 dated Jan. 12, 2023.

* cited by examiner

DEFECT DETECTION FOR MULTI-DIE MASKS

BACKGROUND OF THE INVENTION

1. Field of the Invention

This invention generally relates to the field of mask inspection. More particularly, the present invention relates to methods and systems for detecting defects on multi-die masks.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a photomask to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

With the performance of 193 nm immersion lithography reaching its limit as well as the substantially high cost and yield issues associated with multi-patterning lithography processes, extreme ultraviolet (EUV) lithography has been under extensive development. It is the leading candidate of next generation lithography (NGL) technology to extend Moore's law, driving computer chips to be smaller, faster, and more efficient.

Detecting lithographically significant defects on masks is one of the most critical process control steps in the semiconductor industry. Today, mask inspection can be done using either die-to-database (DB) or die-to-die (DD) modes, depending on the mask layout. Especially for the 5 nm technology node and beyond, EUV techniques are being widely adapted. However, the actinic EUV mask inspection tool is not yet mature, so it is challenging to reliably extend the resolution-limited inspection tool for EUV mask defect detection.

The currently available methods and systems for mask inspection have several other disadvantages. For example, DB inspection performance is impacted by the rendering quality as its reference image is rendered from the design database. With more complex optical proximity correction (OPC) designs on patterns with relatively tight pitches on masks, the rendering error is more pronounced and limits the usable sensitivity of DB inspection. DD inspection detects defects by comparing optical images between one die and the other. It cannot detect systematic writer errors and its performance is impacted by the photomask quality and focus control of the inspection tool. When mask patterns are substantially sensitive to focus, such as contact and metal layers, it is significantly challenging to have reliable detection results. In addition, EUV photomasks may have flare correction which causes OPC variations on different dies. This may also limit the usable sensitivity of DD inspection.

Accordingly, it would be advantageous to develop methods and/or systems for detecting defects on a mask that do not have one or more of the disadvantages described above.

SUMMARY OF THE INVENTION

The following description of various embodiments is not to be construed in any way as limiting the subject matter of the appended claims.

One embodiment relates to a system configured for detecting defects on a mask. The system includes an imaging subsystem configured to generate images of a mask having multiple dies formed thereon. The system also includes a computer subsystem configured for generating a database reference image for the mask by simulating a physical version of the mask from a design for the mask and simulating an image of the physical version of the mask generated by the imaging subsystem from the simulated physical version of the mask. The computer subsystem is also configured for detecting first defects on the mask by comparing the database reference image to the images of the mask generated by the imaging subsystem for a first of the multiple dies. In addition, the computer subsystem is configured for generating a die reference image for the first of the multiple dies by applying one or more parameters of the imaging subsystem learned by generating the database reference image to the images generated by the imaging subsystem of one or more of the multiple dies other than the first of the multiple dies. The computer subsystem is further configured for detecting second defects on the mask by comparing the die reference image to the images of the mask generated by the imaging subsystem for the first of the multiple dies. The system may be further configured as described herein.

Another embodiment relates to a computer-implemented method for detecting defects on a mask. The method includes the generating a database reference image, detecting first defects, generating a die reference image, and detecting second defects steps described above, which are performed by a computer subsystem coupled to the imaging subsystem described above. The method may be performed as described further herein. The method may include any other step(s) of any other method(s) described herein. The method may be performed by any of the systems described herein.

Another embodiment relates to a non-transitory computer-readable medium storing program instructions executable on a computer system for performing a computer-implemented method for detecting defects on a mask. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
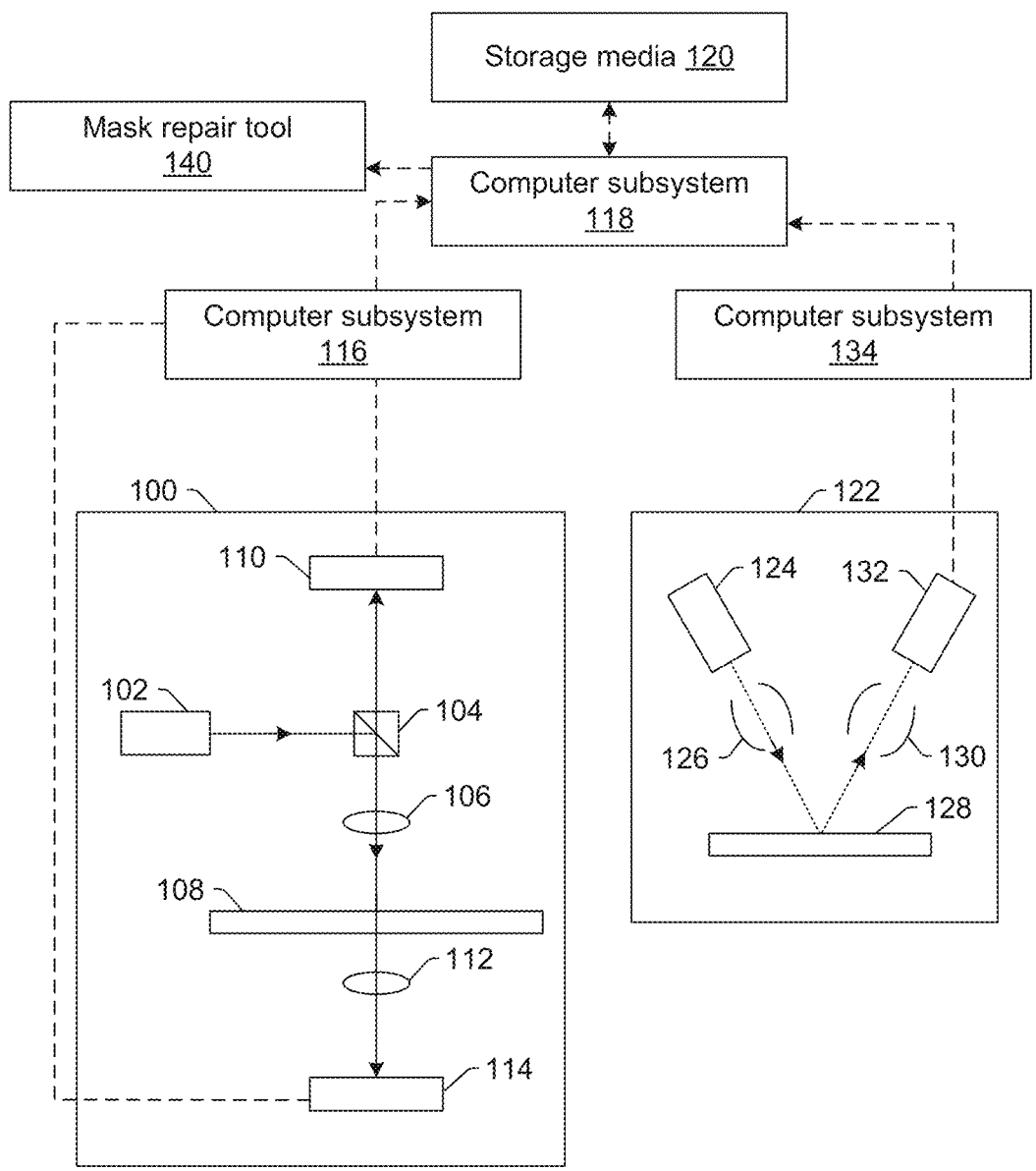
FIGS. 1 and 2 are schematic diagrams illustrating a side view of embodiments of a system configured for detecting defects on a mask.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design," "design data," and "design information" as used interchangeably herein generally refer to the physical design (layout) of an IC or other semiconductor device and data derived from the physical design through complex simulation or simple geometric and Boolean operations. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data. Furthermore, the "design," "design data," and "design information" described herein refers to information and data that is generated by semiconductor device designers in a design process and is therefore available for use in the embodiments described herein well in advance of printing of the design on any physical specimens such as reticles and wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

The embodiments described herein generally relate to systems and methods for detecting defects on a mask. As described further herein, the embodiments combine certain aspects of die-to-die and die-to-database inspection methods in new and unique ways for defect detection on photomasks (also referred to herein as "masks") with multi-die layouts. In addition, the embodiments described herein can advantageously be used to reliably detect lithographically significant defects on masks with multi-die layouts.

One embodiment relates to a system configured for detecting defects on a mask. One embodiment of such a system is shown in FIG. 1. The system includes an imaging subsystem configured to generate images of a mask having multiple dies formed thereon. The imaging subsystems described herein may generate the images by directing energy to a mask and detecting energy from the mask. The imaging subsystems described herein may use a variety of possible energy types for generating the images.

In one embodiment, the mask is configured for use at one or more extreme ultraviolet (EUV) wavelengths of light. Such a mask may then be referred to as an EUV mask. In other words, the mask may be configured for use in a lithography process that uses one or more EUV wavelengths of light to transfer the pattern from the mask to a wafer (e.g., by reflecting the EUV light off the mask to the wafer). In this manner, the actinic wavelength of the mask (i.e., the wavelength of light that is used to transfer a pattern from the mask to a wafer thereby causing a photochemical reaction in one or more materials on the wafer, e.g., a photoresist) may be different from the wavelength(s) of light or in the type of energy used for imaging of the mask by the embodiments described herein. Although the embodiments described herein are particularly useful for defect detection on EUV masks, the embodiments may also be useful for defect detection on other types of multi-die masks such as masks designed for use at one or more deep ultraviolet (DUV) wavelengths of light (i.e., multi-die, optical or DUV masks).

In one embodiment, the imaging subsystem is configured to generate the images of the mask by illuminating the mask with light having a wavelength of 193 nm. In another embodiment, the imaging subsystem is configured to generate the images of the mask by illuminating the mask with light having one or more wavelengths in a range from 193 nm to 257 nm. In an additional embodiment, the imaging subsystem is configured to generate the images of the mask by illuminating the mask with light having a wavelength of 13.5 nm (or another EUV wavelength of light). In a further embodiment, the imaging subsystem is configured to generate the images of the mask by illuminating the mask with electrons. In still another embodiment, the imaging subsystem is configured to generate the images of the mask by illuminating the mask with ions.

As shown in FIG. 1, the system may include imaging subsystem 100 configured to generate images of the mask using light having one or more of the wavelengths described above and/or imaging subsystem 122 configured to generate images of the mask using charged particles such as electrons or ions. Therefore, the system as shown in FIG. 1 may include only one imaging subsystem or more than one imaging subsystem, which may include one or more of the imaging subsystems shown in FIG. 1 and/or the imaging subsystem shown in FIG. 2.

As further shown in FIG. 1, imaging subsystem 100 includes light source 102. Light source 102 may include any suitable light source known in the art such as a laser. Light source 102 is configured to direct light to beam splitter 104, which is configured to reflect the light from light source 102 to refractive optical element 106. Refractive optical element 106 is configured to focus light from beam splitter 104 to mask 108. Beam splitter 104 may include any suitable beam splitter such as a 50/50 beam splitter. Refractive optical element 106 may include any suitable refractive optical element, and although refractive optical element 106 is shown in FIG. 1 as a single refractive optical element, it may be replaced with one or more refractive optical elements and/or one or more reflective optical elements.

Light source 102, beam splitter 104, and refractive optical element 106 may, therefore, form an illumination channel for the imaging subsystem. The illumination channel may include any other suitable elements (not shown in FIG. 1) such as one or more polarizing components, diffractive optical elements (DOEs), and one or more filters such as spectral filters. As shown in FIG. 1, the light source, beam splitter, and refractive optical element are configured such that the light is directed to the mask at a normal or substantially normal angle of incidence. The imaging subsystem may be configured to scan the light over the mask in any suitable manner.

Light reflected from mask 108 due to illumination may be collected by refractive optical element 106 and directed through beam splitter 104 to detector 110. Therefore, the refractive optical element, beam splitter, and detector may form a detection channel of the imaging subsystem. The detector may include any suitable imaging detector known in the art such as a charge coupled device (CCD) or time-delayed integrator (TDI). This detection channel may also include one or more additional components (not shown in FIG. 1) such as one or more polarizing components, one or more spatial filters, one or more spectral filters, and the like. Detector 110 is configured to generate output that is responsive to the reflected light detected by the detector. The output may include signals, signal data, images, image data, and any other suitable output.

In some embodiments, the imaging subsystem may also or alternatively generate images of the mask by detecting light transmitted by the mask. For example, light transmitted by mask 108 due to illumination may be collected by refractive optical element 112 and directed to detector 114. Therefore, refractive optical element 112 and detector 114 may form another detection channel of the imaging subsystem. Detector 114 may include any of the imaging detectors described above and may be further configured as described above. This detection channel may also include one or more additional components (not shown in FIG. 1) including any of those described above.

The imaging subsystem may be configured to have more than one mode in any suitable manner. In some instances, the imaging subsystem can have more than one mode sequentially (e.g., by changing one or more parameters of an imaging lens of the imaging subsystem such as numerical aperture (NA) between scans of a mask). Furthermore, the imaging subsystem can scan the mask with some modes simultaneously and other modes sequentially. The system may be configured to control the optical mode(s) used for any scan of any mask in any suitable manner.

The system may include a number of other components that are not shown in FIG. 1. For example, the system may include a load module, an alignment module, a handler such as a robotic transfer arm, and an environmental control module and may include any such components known in the art.

As shown in FIG. 1, the system includes computer subsystem 116 coupled to imaging subsystem 100. For example, the computer subsystem may be coupled to detector(s), e.g., detectors 110 and 114, of the imaging subsystem (e.g., by one or more transmission media shown by the dashed lines in FIG. 1, which may include any suitable transmission media known in the art). The computer subsystem may be coupled to the detector(s) in any suitable manner such that output (e.g., images) and any other information for the mask generated by the imaging subsystem can be sent to the computer subsystem and, optionally, such that the computer subsystem can send instructions to the imaging subsystem to perform one or more steps.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, the different computer subsystems may be coupled to each other such that images, data, information, instructions, etc. can be sent between the computer subsystems as described further herein. For example, computer subsystem 116 may be coupled to computer subsystem 118 (as shown by the dashed line in FIG. 1) by any suitable transmission media, which may include any suitable wired and/or wireless transmission media known in the art. Two or more of such computer subsystems may also be effectively coupled by a shared computer-readable storage medium (not shown).

The system may also or alternatively include a charged particle beam imaging subsystem configured for generating charged particle beam images of the mask. In one embodiment, the charged particle beam imaging subsystem is configured as an electron beam subsystem. For example, as shown in FIG. 1, the electron beam subsystem may include electron column 122, which is coupled to computer subsystem 134.

The electron column includes electron beam source 124 configured to generate electrons that are focused to mask 128 by one or more elements 126. The electron beam source may include, for example, a cathode source or emitter tip, and one or more elements 126 may include, for example, a gun lens, an anode, a beam limiting aperture, a gate valve, a beam current selection aperture, an objective lens, and a scanning subsystem, all of which may include any such suitable elements known in the art.

Electrons returned from the mask (e.g., secondary electrons) may be focused by one or more elements 130 to detector 132. One or more elements 130 may include, for example, a scanning subsystem, which may be the same scanning subsystem included in element(s) 126. In some embodiments, the electron column may also or alternatively be configured to detect electrons transmitted by the mask. For example, the imaging subsystem may include another detector (not shown in FIG. 1) positioned below the mask such that it detects electrons transmitted by the mask. In this manner, the imaging subsystem may be configured to generate images of the mask by detecting electrons reflected from and/or transmitted by the mask.

The electron column may include any other suitable elements known in the art. In addition, the electron column may be further configured as described in U.S. Pat. No.

8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1 as being configured such that the electrons are directed to the mask at an oblique angle of incidence and are scattered from the mask at another oblique angle, the electron beam may be directed to and scattered from the mask at any suitable angles. In addition, the electron beam subsystem may be configured to use multiple modes to generate images of the mask (e.g., with different illumination angles, collection angles, etc.). The multiple modes of the electron beam subsystem may be different in any image generation parameter(s) of the subsystem.

In another embodiment, the charged particle beam subsystem is configured as an ion beam subsystem. For example, in the electron column shown in FIG. 1, the electron beam source may be replaced with another charged particle beam source such as an ion beam source, which may include any suitable ion beam source known in the art. In addition, the charged particle beam subsystem may have any other suitable ion beam tool configuration such as those included in commercially available focused ion beam (FIB) systems, helium ion microscopy (HIM) systems, and secondary ion mass spectroscopy (SIMS) systems.

Computer subsystem 134 may be coupled to detector 132 as described above. The detector may detect charged particles returned from the surface of the mask thereby forming charged particle beam images of the mask. The charged particle beam images may include any suitable charged particle beam images. Computer subsystem 134 may be configured to perform any of the functions described herein using the output of the detector and/or the charged particle beam images. Computer subsystem 134 may be configured to perform any additional step(s) described herein. Computer subsystem 134 may also be further configured as described herein.

The charged particle beam subsystem may be configured as a scanning electron microscope (SEM), and the charged particle beam images may be referred to as "SEM images." The charged particle beam subsystem may, however, have any suitable configuration for generating the charged particle beam images including SEMs and other types of electron beam tools, e.g., transmission electron microscopes (TEMs). In addition, the charged particle beam subsystem included in the system may include a commercially available electron beam tool such as the Mask DR-SEM E5600 Series and Mask MVM-SEM® E3600 Series of tools that are commercially available from Advantest America, Inc., San Jose, Calif.

The computer subsystem(s) included in the system may also include a computer subsystem such as computer subsystem 118 that is not coupled to any of the imaging subsystem(s). In this manner, one of the computer subsystems may be a stand alone type computer subsystem, which may be coupled to the other computer subsystems shown in FIG. 1. For example, a stand alone type computer subsystem may be configured to acquire the images described herein and to perform other steps described herein. In one such example, computer subsystems 116 and 134 may be configured to store images received from their respectively coupled imaging subsystems and to store the images in storage media 120, which may be further configured as described herein. The stand alone type computer subsystem may then acquire the images from the storage media and perform one or more steps described herein using any or all of the images.

Figure 2:
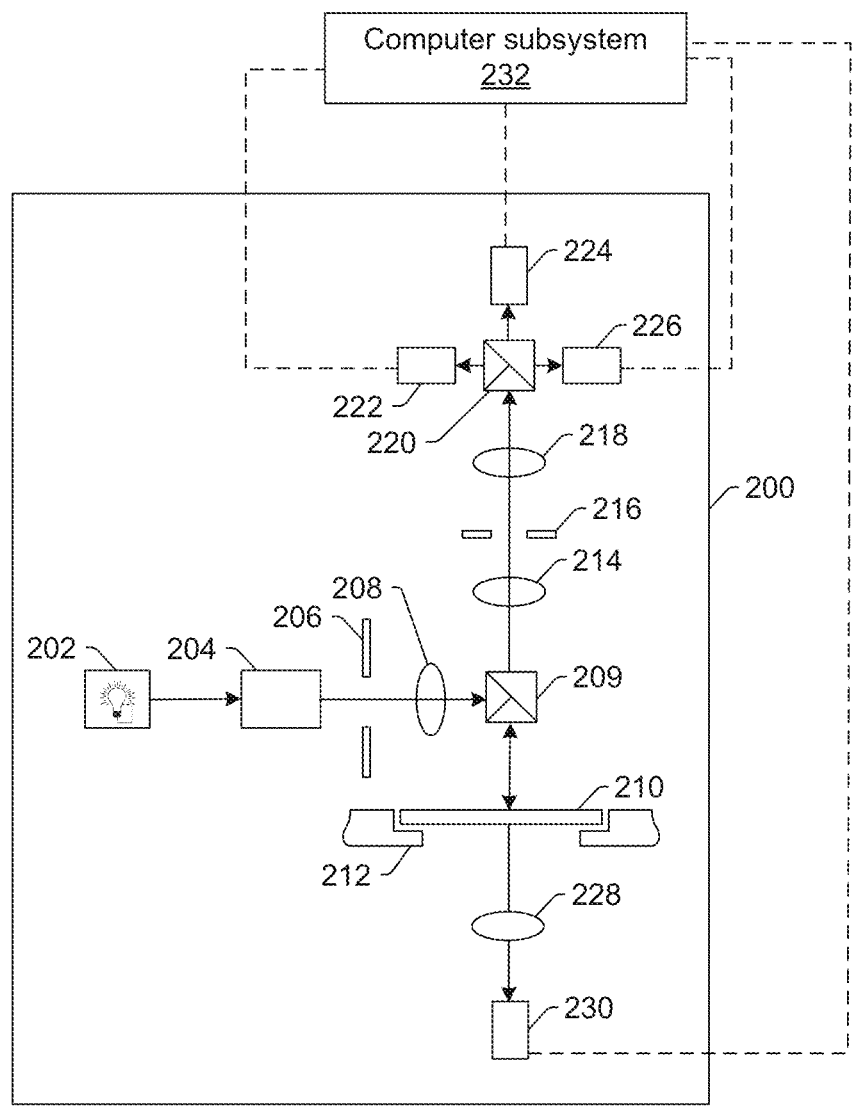

As noted above, the system may include more than one imaging subsystem. The imaging subsystem shown in FIG. 2 may be used in combination with or instead of the any of the imaging subsystems shown in FIG. 1. As shown in FIG. 2, imaging subsystem 200 includes an illumination subsystem and a collection subsystem. The illumination subsystem includes light source 202. Light source 202 may be a coherent light source such as a laser. The light source may be configured to emit monochromatic light having a wavelength of 248 nm, 193 nm, and/or another DUV or EUV wavelength described herein. Alternatively, the light source may be configured to emit light having a range of wavelengths and may be coupled to a spectral filter (not shown). An example of a broadband light source includes, but is not limited to, a He—Xe arc lamp that generates light in the DUV wavelength regime. In this manner, the light source and the filter may emit monochromatic light having a wavelength as described above. The light source may be configured to emit light continuously or at various time intervals in pulses.

The illumination subsystem may also include a number of optical components coupled to the light source. For example, light from light source 202 may first pass through homogenizer 204. Homogenizer 204 may be configured to reduce speckle of the light from the light source. The illumination subsystem may also include aperture 206. Aperture 206 may have an adjustable NA. For example, the aperture may be coupled to a control mechanism that may be configured to mechanically alter the aperture depending upon a control signal received from a user or from program instructions received from a program recipe being run on the system. In this manner, the light may have various partial coherence factors, $\sigma$. For example, aperture 206 may be altered to adjust a pupil of condenser lens 208. The pupil of the condenser lens controls the NA of the system. As the pupil of the condenser lens is reduced, coherence of the illumination increases thereby decreasing the value of $\sigma$. The value of $\sigma$ may be expressed as the ratio of the NA of the condenser lens to the NA of the objective lens. Exposure systems may have a value of $\sigma$ in a range between about 0.3 to about 0.9. Therefore, aperture 206 may be altered such that the imaging subsystem has a value of $\sigma$ between about 0.3 and about 0.9. The value of $\sigma$ may be altered depending upon the features on the mask. For example, a higher value for $\sigma$ may be used if the mask includes lines and spaces than if the mask includes contact holes. The control mechanism may also be configured to alter the aperture to provide annular or off-axis illumination. The aperture may also be configured to provide other types of illumination such as quadrapole or dipolar illumination. The aperture may be further configured to alter a shape of the beam of light. For example, the aperture may be a diffraction optical element or an apodization aperture.

The illumination subsystem may also include a number of additional optical components (not shown). For example, the illumination subsystem may also include a telescope configured to alter the beam diameter of the light. In addition, the illumination subsystem may include one or more relay lenses, additional lenses such as a field lens, folding mirrors, additional apertures, and beamsplitters.

The illumination subsystem may also include condenser lens 208. Condenser lens 208 may be configured to alter a diameter of the light in the object (mask) plane to approximately, or greater than, the field of view of the subsystem.

Light exiting the condenser lens may be directed to beam splitter 209 that directs light from the condenser lens to mask 210 to thereby illuminate mask 210 supported upon stage 212. Beam splitter 209 may include any suitable beam splitter known in the art.

The stage is configured to support the mask by contacting the mask proximate outer lateral edges of the mask. Stage 212 may be configured to move the mask such that an alignment of the mask may be altered and such that light may scan across the mask. Alternatively, the illumination subsystem may include a scanning element (not shown) such as an acousto-optical deflector or a mechanical scanning assembly such that the mask may remain substantially stationary while the light is scanned across the mask. Stage 212 may also be configured to move the mask through focus thereby altering a focus setting of the imaging subsystem. The stage may also be coupled to an autofocusing device (not shown) that is configured to alter a position of the stage thereby altering a position of the mask to maintain a focus setting of the imaging subsystem during imaging. Alternatively, an autofocusing device may be coupled to the objective lens to alter a position of the objective lens to maintain the focus setting during imaging.

The imaging subsystem may also include a number of optical components arranged to form a collection subsystem. For example, the collection subsystem includes objective lens 214. Light reflected by the mask is collected by objective lens 214. The collection subsystem also includes aperture 216 having an adjustable NA. The NA of aperture 216 may also be selected such that light exiting the aperture has a selected magnification. Aperture 216 is positioned between objective lens 214 and lens 218, which may be configured as a tube lens. Light from lens 218 may be directed to beamsplitter 220. Beamsplitter 220 may be configured to direct the light to three detectors 222, 224, and 226. The collection subsystem may also include a number of additional optical components (not shown) such as a magnification lens. The magnification lens may be positioned between lens 218 and beamsplitter 220.

Detectors 222, 224, and 226 may be configured to form an image of the light reflected by an illuminated portion of the mask. Such an image may be referred to as an "aerial image." The detectors may include, for example, CCDs or TDI cameras. The detectors may also have a one-dimensional or two-dimensional array of pixels. Each of the three detectors may have a different focus setting. In this manner, the three detectors may form images of the mask at three different focus settings substantially simultaneously. For example, one detector may be substantially in focus, and the other two detectors may be out of focus in opposite directions with respect to the in-focus condition. In addition, the imaging subsystem may include any number of such detectors depending on the mechanical or physical constraints of the imaging subsystem.

Alternatively, the imaging subsystem may only include one detector configured to form an image of the mask. The detector may have a focus setting approximately equal to a focus setting of an exposure system. Images of the mask at different focus settings may be formed by altering the focus setting of the detector after each image is formed. In such an embodiment, beamsplitter 220 would not be necessary to split the light to multiple detectors.

The imaging subsystem may also include a number of optical components configured to generate images of light transmitted by the mask. For example, the collection subsystem may include objective lens 228. Light transmitted by the mask is collected by objective lens 228 and directed to detector 230. Each of these components may be configured as described further above. The transmitted light detection channel formed by objective lens 228 and detector 230 may also include any other optical components described herein. The imaging subsystem shown in FIG. 2 may also be configured to generate images of the mask with multiple modes as described further herein (e.g., with two or more different values of at least one of the imaging parameters of the imaging subsystem).

Computer subsystem 232 may be coupled to imaging subsystem 200. For example, the computer subsystem may be coupled to a detector, e.g., detectors 222, 224, 226, and 230, of the imaging subsystem (e.g., by one or more transmission media shown by the dashed lines in FIG. 2, which may include any suitable transmission media known in the art). The computer subsystem may be coupled to the detectors in any suitable manner. The computer subsystem may be coupled to the imaging subsystem in any other suitable manner such that image(s) and any other information for the mask generated by the imaging subsystem can be sent to the computer subsystem and, optionally, such that the computer subsystem can send instructions to the imaging subsystem to perform one or more steps described herein.

It is noted that FIGS. 1 and 2 are provided herein to generally illustrate some configurations of imaging subsystems that may be included in the embodiments described herein. Obviously, the configurations of the imaging subsystems described herein may be altered to optimize the performance of the system as is normally performed when designing a commercial imaging system. In addition, the systems described herein may be implemented using existing imaging subsystems (e.g., by adding functionality described herein to an existing imaging system) such as the mask inspection tools that are commercially available from KLA Corp., Milpitas, Calif. For some such systems, the embodiments described herein may be provided as optional functionality of the system (e.g., in addition to other functionality of the system). Alternatively, the systems described herein may be designed "from scratch" to provide a completely new system.

Although only one charged particle imaging subsystem is shown in the figures, the system may include two charged particle beam subsystems (e.g., one for inspection imaging and the other for defect review imaging). The two charged particle beam subsystems may be different in one or more parameters such that one of the subsystems is particularly suited for inspection imaging while the other is particularly suited for another process such as defect review or metrology. For example, the two subsystems may be different in resolution capability (such that the subsystem used for inspection has a lower resolution capability than the one used for defect review or metrology). However, if the system includes only one charged particle beam imaging subsystem, that subsystem may be configured to have variable parameters so that it can be used for both inspection and defect review or another relatively high resolution process such as metrology. One or more parameters of the subsystem can be altered between inspection and the other process such that the subsystem can be used for both tasks. For example, the charged particle beam subsystem shown in FIG. 1 may be configured to have a higher resolution if it is to be used for defect review or metrology rather than for inspection. In other words, the embodiments of the charged particle beam subsystem shown in FIG. 1 describe some general and various configurations for charged particle beam subsystems that can be tailored in a number of manners that will be obvious to one skilled in the art to produce subsystems having different imaging capabilities that are more or less suitable for different applications. The light-based imaging subsystem(s) that are included in the system may be configured in manners similar to that described above.

As noted above, the imaging subsystems may be configured for directing energy (e.g., light, electrons, ions) to and/or scanning energy over a physical version of the mask thereby generating actual images for the physical version of the mask. In this manner, the imaging subsystems may be configured as "actual" imaging systems, rather than "virtual" systems. A storage medium (such as storage media 120) and computer subsystem 118 shown in FIG. 1 may be configured as a "virtual" system. Systems and methods configured as "virtual" systems are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments described herein may be further configured as described in these patents.

Figure 3:
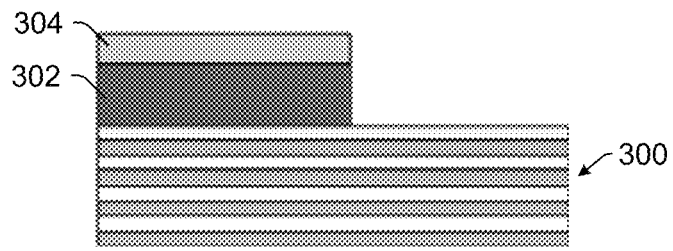
FIG. 3 is a schematic diagram illustrating a side view of one example of a portion of an extreme ultraviolet (EUV) mask.

A typical EUV photomask stack is illustrated in FIG. 3. The mask substrate (not shown) is covered with 40 pairs of molybdenum (Mo)/silicon (Si) multilayer (ML) thin films capped with a relatively thin layer of ruthenium (Ru), shown collectively as thin films 300 in FIG. 3. A bilayer film of tantalum boron nitride (TaBN) 302 and tantalum boron oxide (TaBO) 304 acts as the absorber, which is selectively etched to form the mask pattern.

Figure 4:
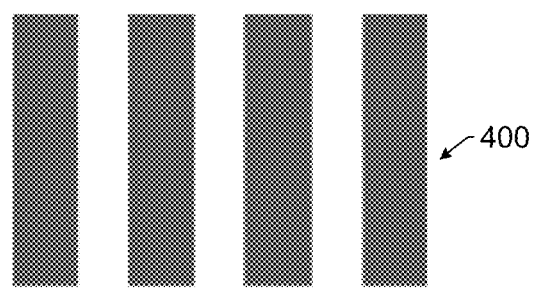
FIG. 4 is a schematic diagram illustrating a plan view of one example of a portion of an EUV mask pattern without any defects.
Figure 5:
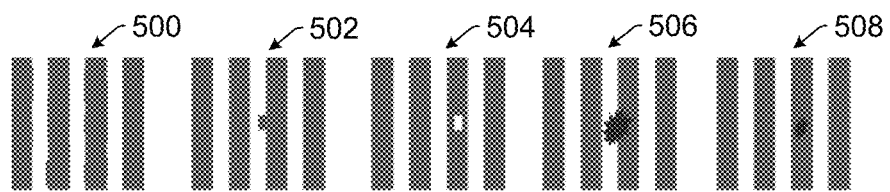
FIG. 5 is a schematic diagram illustrating a plan view of the portion of the EUV mask pattern of FIG. 4 with various examples of defects that may be detected therein.

FIG. 4 shows one example of a defect free mask pattern 400, where color areas indicate absorber and non-color areas indicates ML. FIG. 5 shows some examples of different types of defects that may be present in the mask pattern and may be detected and classified as described further herein. If there is no significant defect and only local line edge roughness (LER) contributes to the detected inspection signal or image, the detected defect is called LER as shown by defect example 500. If a defect, like a protrusion or intrusion, is connected to an absorber, the detected defect is called a hard-defect as shown by defect example 502. If the absorber has a pin-hole and the bottom ML is exposed by the pin-hole, the detected defect is a pin-hole defect as shown by defect example 504. If a portion of a particle or a whole particle is located on the ML, the particle or particle portion has a printability impact on wafer exposure and is classified as a particle-on-ML as shown by defect example 506. If a particle is completely on the absorber, the particle may not have any printability impact on the wafer exposure and goes to a different bin, which is particle-on-absorber as shown by defect example 508.

Figure 6:
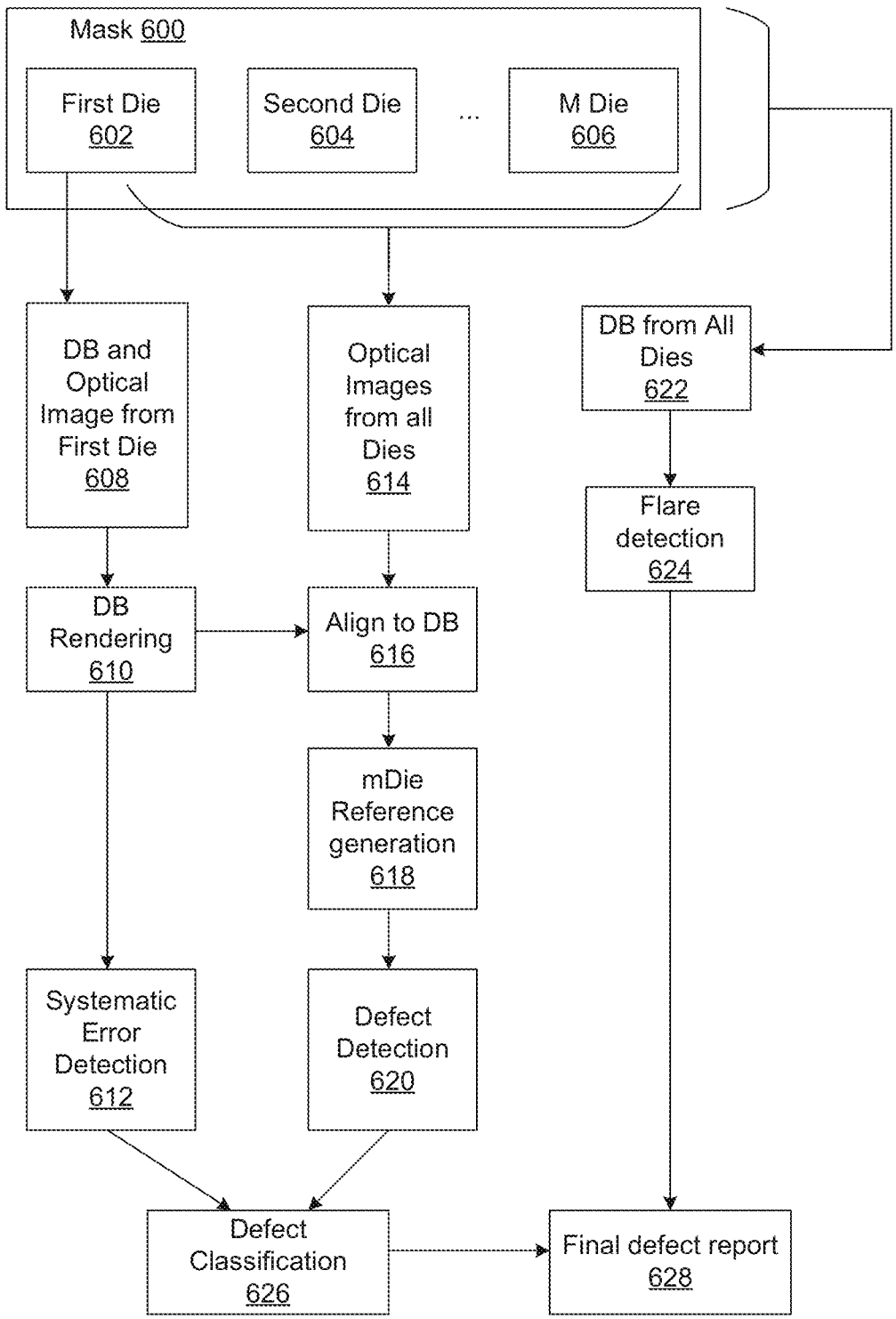
FIG. 6 is a flow chart illustrating one embodiment of steps that may be performed by the embodiments described herein for detecting defects on a mask.

The embodiments described herein have a number of new and advantageous components aimed at resolving disadvantages of currently used die-to-database (DB) or die-to-die (DD) inspection methods and systems. One of these components is a DB detection flow in which the DB design and corresponding image from the first die of a multi-die mask are acquired. For example, as shown in FIG. 6, mask 600 may have multiple dies formed thereon. In this example, mask 600 is shown with first die 602, second die 604, . . . , M die 606. Therefore, this mask example includes at least 3 dies, but the embodiments described herein may be used for a mask having any number of dies (i.e., two or more dies) formed thereon in any arrangement on the mask. In addition, the dies on the mask may include any type of dies for any type of semiconductor device for which a mask can be used to print features on a wafer or other specimen. The DB detection flow may include, as shown in step 608, acquiring a design (DB) and an optical (or other) image from the first die. The design may be acquired by the computer subsystem in any suitable manner known in the art. The image for the first die may also be acquired using one of the imaging subsystems described herein or from a storage medium in which the image has been stored by a computer subsystem coupled to one of the imaging subsystems.

The computer subsystem is configured for generating a database (DB) reference image for the mask by simulating a physical version of the mask from a design for the mask and simulating an image of the physical version of the mask generated by the imaging subsystem from the simulated physical version of the mask. The DB detection flow may perform these simulations in DB rendering step 610. In this manner, the computer subsystem may generate the DB reference image by simulating the physical mask having the design formed thereon and then how that mask would appear in images generated by the imaging subsystem.

In one embodiment, simulating the physical version of the mask includes nearfield modeling, and simulating the image of the physical version of the mask includes partial coherent illumination modeling. In this manner, the DB reference image may be rendered from a DB design combining nearfield modeling, which is to capture the mask pattern information, and partial coherent illumination modeling. These modeling steps may be performed as described in U.S. Pat. No. 9,478,019 to Sezginer et al. issued Oct. 25, 2016, which is incorporated by reference as if fully set forth herein. The embodiments described herein may be further configured as described in this patent. These modeling steps may also or alternatively be performed in any other suitable manner known in the art.

In another embodiment, simulating the image of the physical version of the mask includes calibrating one or more parameters of the imaging subsystem in a model used for simulating the image of the physical version of the mask for focus and aberration errors in the imaging subsystem. For example, the partial coherent illumination modeling can calibrate the system specific parameters for compensating focus and aberration errors. In one such example, the image from the first die on the mask (or one of the dies on the mask) may be input to the DB rendering step. The design for the mask may be input to the simulations as described above and the simulated image that simulates how the mask would be imaged by the imaging subsystem may be compared to the image generated by the imaging subsystem for the first die (or one of the dies). One or more parameters of the model for the imaging subsystem may then be altered until the simulated image substantially matches the actual image generated by the imaging subsystem, which may be performed in any suitable manner known in the art. In this manner, the model can be calibrated to the specific parameters (including any and all aberrations) of the imaging subsystem used to generate images of the dies on the mask.

This step may be performed using an actual image of a die other than the one that will be used for detecting systematic mask writer errors on the mask via the DB detection flow. In addition, an image of another mask may be used for calibrating the parameter(s) of the imaging subsystem in the model. If that is the case, then for calibration purposes, the inputs to the model(s) would be the design for the other mask and any other pertinent information about that mask. In this manner, the model may be calibrated for the focus and aberration errors in the imaging subsystem using a different mask (other than the one on which defects will be detected). If a different mask is used for calibrating parameter(s) of the model, then the actual image of the other mask used for the calibrating is preferably generated with the same parameter(s) of the imaging subsystem that will be used for the mask that will be inspected. In some such instances, the image of the other mask that is used for the calibrating may be generated specifically for the calibrations if the other mask was not already imaged using the parameters that will be used for inspecting the mask. The other mask that is used for the calibrating may be any other mask that is available, but if multiple possible masks are available for this use, it may be preferable to use the mask that has a design that is most similar to the mask that will be inspected, even if that means that the two masks' only similarity is that they are designed for use at the same wavelength(s).

The computer subsystem is also configured for detecting first defects on the mask by comparing the DB reference image to the images of the mask generated by the imaging subsystem for a first of the multiple dies. For example, the images generated by the imaging subsystem for the first die may be aligned to the DB and compared with the DB reference image. Aligning the first die images to the DB may be performed in any suitable manner, and comparing the first die images with the DB reference image may include subtracting the DB reference die image from the first die images thereby generating difference images. Any differences that stand out are flagged as the potential defect candidates. In one such example, any differences between the images for the first die and the DB reference image may be compared to a threshold for the differences. The differences that have a value above the threshold may be identified by the computer subsystem as defects, potential defects, or defect candidates. The differences that do not have a value above the threshold may not be identified as defects, potential defects, or defect candidates. Of course, this is one particularly useful and perhaps the most simple defect detection method that can be used in this and other defect detection steps described herein, but the embodiments described herein are not limited in the defect detection method that can be used for any of the defect detection steps described herein.

Detecting the first defects on the mask may include comparing the DB reference image to only the images for the first die. However, DB detection may include comparing the DB reference image to the images for all of the dies. For example, the DB detection is used herein to detect defects that occur repeatedly in multiple dies and therefore may not be detected in DD inspection due to the very die-to-die nature of such detection, which is always the case for defects that repeat in every die and is sometimes the case for defects that repeat in fewer than all of the dies. Therefore, in many instances, DB inspection may include comparing the DB reference image to only one of the multiple dies, and the "first die" may include the die on the mask that is first to be scanned. The "first die" may however include any other die on the mask. In other words, generally, DB inspection can be performed using the DB reference image and the images generated for any one die on the mask, and a user or the computer subsystem may select any of the dies for that defect detection.

In one embodiment, the first defects include systematic mask writer errors. For example, the goal of the DB detection flow is to detect the systematic writer error. The term "systematic writer error" as used herein is defined as errors on the mask that occur systematically (in each of the dies or more than two of the dies) due to the mask writer itself. As shown in step 612, the computer subsystem may perform systematic error detection. Because the rendered mask image is used for detecting systematic writer errors (and not necessarily for other defect detection steps described herein), the rendering error budget is looser and does not limit the usable sensitivity. One advantage of the embodiments described herein is therefore that they provide the capability of detecting systematic writer errors.

Another major component of the embodiments described herein that provides advantages over currently used mask inspection methods and systems is the main detection flow combining aspects of both DD and DB detection flows. One advantage of the embodiments described herein is that they combine aspects of DD and DB detection flows for multi-die layout masks with substantially high usable sensitivity using mask inspection tools. In this manner, the embodiments described herein provide a kind of new inspection mode that combines aspects of both DD and DB detection flows.

The computer subsystem is further configured for generating a die reference image for the first of the multiple dies by applying one or more parameters of the imaging subsystem learned by generating the DB reference image to the images generated by the imaging subsystem of one or more of the multiple dies other than the first of the multiple dies. This die reference image is also referred to herein as the "mDie reference image." Prior to generating the mDie reference image, the images of all (or at least some) of the dies may be acquired and aligned to the DB design or some other common reference. For example, as shown in FIG. 6, optical (or other) images from all dies may be acquired in step 614. Acquiring the images from all of the dies may be performed as described further herein. Aligning the images to the DB design or some other common reference may be performed in any suitable manner known in the art.

For an image from the first die, the mDie reference image is rendered using all (or at least some) of the images of the rest of the dies and the system specific parameters from the DB detection flow. When generating an mDie reference image for one of the dies, it may be preferable to use the images of all of the other dies on the mask. However, that is not necessary in every instance. For example, if there are more than 3 dies on a mask, when generating an mDie reference image for one of the dies, the images for two or more, but not necessarily all, of the other dies may be used. In general, the more die images that are used to generate an mDie reference image, the better that mDie reference image will be for defect detection (since using more die images for mDie reference image generation will better average out any die-to-die differences thereby producing a die reference image that is more "defect free"). However, depending on the mask configuration/layout and practical considerations, the mDie reference image can be generated from as few as 2 die images or as many die images as the user prefers.

As shown in step 616, the die images from (all or at least some of) the dies may be aligned to the DB (design information). This alignment step may be performed in any suitable manner known in the art. Although aligning each of the die images to the design may be preferable, alignment may be performed with respect to any other common reference. As shown in step 618, the mDie reference image generation may be performed using all or at least some of the die images that have been aligned to the design or another common reference and therefore to each other.

Applying one or more parameters of the imaging subsystem learned by generating the DB reference image to the images generated by the imaging subsystem of one or more of the multiple dies other than the first of the multiple dies essentially utilizes DB rendering in a DD inspection to overcome the focus compensation limitation in a traditional DD inspection. For example, in a traditional DD inspection, in addition to the pattern line edge roughness (LER) noise which can be mitigated by the mDie average, focus distance between the reference and test dies is a major contributing factor in its performance. For an optical mask with both transmitting light (TL) and reflective light (RL), a physics-based method can improve the matching between the reference and test dies. However, in an all reflective system, such as some of the EUV mask inspection platforms described herein, traditional DD inspection suffers from the limitation in the empirical model in focus compensation. Utilization of DB rendering for the purpose of focus compensation in the new DD approach can improve the focus matching between the images for the reference and test dies while simultaneously overcoming the general DB rendering noise.

In one embodiment, the one or more parameters of the imaging subsystem learned by generating the DB reference image include basis images representing focus and aberration errors in the imaging subsystem, and generating the die reference image includes synthesizing the die reference image as a linear combination of the images generated by the imaging subsystem of the one or more of the multiple dies other than the first of the multiple dies and the basis images. Theoretically, the mDie reference image of each die can be synthesized as the linear combination of the images from the other dies and the basis images representing focus and aberration from the DB detection flow. The basis images are from the DB rendering from design data. The basis images contain tool specific information such as focus and aberration so that they can be used to overcome the focus error in the mDie reference image. After solving the linear optimization equations, it is expected that in the synthesized mDie reference image, the errors among different dies on the mask will be averaged out while the focus related errors will be compensated. The embodiments described herein may therefore use DB modeling information to handle the tool related errors in traditional DD detection and may use the mDie reference image to handle the plate error and avoid modeling noise. In this manner, the embodiments described herein can maximize usable sensitivity by reducing rendering error, photomask imperfection and tool focus variation. One advantage of the embodiments described herein is therefore that they utilize the multi-die average and DB focus compensation to generate mDie reference images with substantially high quality.

The computer subsystem is also configured for detecting second defects on the mask by comparing the die reference image to the images of the mask generated by the imaging subsystem for the first of the multiple dies. For example, as shown in step 620, the computer subsystem may perform defect detection using the mDie reference image. In this step, the image of every die is compared with its corresponding mDie reference image. Although this step may be performed for every die, that is not necessary and the second defect detection may be performed for any or all of the dies on the mask. Detecting the second defects may otherwise be performed as described further herein.

In one embodiment, the computer subsystem is configured for generating an additional die reference image for a second of the multiple dies by applying the one or more parameters of the imaging subsystem learned by generating the DB reference image to the images generated by the imaging subsystem of one or more of the multiple dies other than the second of the multiple dies, and detecting the second defects on the mask includes comparing the additional die reference image to the images of the mask generated by the imaging subsystem for the second of the multiple dies. For example, for every image from each die, an mDie reference image may be rendered using all of the images of the rest of the dies and the system specific parameters from the DB detection flow, respectively. In this manner, each die may have its own mDie reference image, and the DD detection may be performed for each die thereby reliably detecting the real defects with substantially accurate locations.

In another embodiment, the computer subsystem is configured for determining a characteristic of one or more features of the mask in an inspection region of the images of the first of the multiple dies on the mask, and based on the determined characteristic, selecting the DB reference image or the die reference image for detecting the second defects in the inspection region. In this manner, the image of every die may be compared with its corresponding mDie reference image and the DB rendered reference image from the DB detection flow. If the inspection region mainly contains relatively complex 2D patterns where the DB rendered reference image quality is generally low, the mDie reference image is used. In contrast, if the inspection region mainly contains relatively dense repeating patterns where the DB rendered reference image quality is generally high, the DB rendered reference image is used as the final reference to check the potential defects. With this smart reference image selection strategy, the system always chooses defects with better signal-to-noise ratio (SNR) and the usable sensitivity is maximized. One advantage of the embodiments described herein is therefore that they provide a smart reference image selection strategy to maximally detect defects with better SNR.

In some embodiments, the computer subsystem is configured for acquiring information for one or more patterns closest to the first and second defects on the mask and classifying the first and second defects based on the information for the one or more patterns closest to the first and second defects on the mask, respectively. All the defect candidates, including the ones from the DB detection flow, may be further classified based on the surrounding pattern geometries. For example, as shown in step 626 of FIG. 6, the computer subsystem may perform defect classification for defects detected in both the DB and DD detection flows. DB design with substantially high resolution may be used in this step so that the pattern geometries are substantially accurately recognized based on relatively sophisticated dissection rules.

The computer subsystem may determine which of the patterns on the mask that a detected defect is closest to and how close the detected defect is to those patterns in a number of different ways. For example, by aligning the images used for DB and DD inspection flows to the design, the defect locations in the images can be determined with respect to the design (e.g., by a simple coordinate transformation from image coordinates to design coordinates). The design coordinates for the defects can then be used to identify spatial information for the detected defects relative to patterns in the design on the mask using the design coordinates of the patterns in the design.

Determining information for the pattern(s) closest to the defects may include identifying which of the pattern(s) that a detected defect overlaps with, which may be the case if the defect is located within or at least partially overlaps with one or more patterns, or which of the pattern(s) is defective. Determining information for the pattern(s) closest to the defects may also include determining the location of a detected defect with respect to the pattern(s) (regardless of whether or not the detected defect overlaps with or is within a patterned feature itself). For example, if a detected defect is (at least partially) spatially coincident with a patterned feature, determining information for the pattern(s) closest to the defects may include determining the location of the detected defect with respect to the perimeter or outer boundary of the patterned feature.

If a detected defect is not spatially coincident with a patterned feature, determining information for the pattern(s) closest to the defects may include identifying the patterned feature that the defect is closest to and then determining how close the defect is to the patterned feature. Determining information for the pattern(s) closest to the defects may also include determining how close (in some length dimensions) that a detected defect is to a particular part of a patterned feature (e.g., a corner, a side, an end, etc.). The space between the detected defect and the patterned feature that it is closest to may be expressed as a single value, a range of values, an average, a function, or in any other suitable manner.

In addition, a user may particularly care about how close a detected defect is to a subset of the patterned features of the mask. For example, determining information for the pattern(s) closest to the defects may be performed such that the detected defect location relative to its closest patterned feature is determined and/or the detected defect location relative to any one type of patterned feature is determined. The relative location of a detected defect to a patterned feature that may not be closest to the defect may otherwise be determined as described herein.

In a further embodiment, the computer subsystem is configured for determining classification categories for the first and second defects and assigning scores to the first and second defects based on the determined classification categories, and the scores indicate a severity of the first and second defects for a lithography process performed with the mask. In this manner, defect candidates with different classification categories may be assigned different scores indicating their severity so that a user can focus on the lithographically significant defects. In some embodiments, the systems described herein can provide a user interface that is configured so that a user can specify the severity for different defect types.

Determining classification categories for the detected defects may be performed in any suitable manner. For example, the computer subsystem may determine one or more characteristics of the detected defects based on the images of the defects generated by the imaging subsystem (e.g., the test images), the difference images of the defects generated by either or both of the detection flows, the reference images used to detect the defects, or some combination thereof. Those characteristic(s) may include, for example, size, shape, orientation, location, location relative to any nearby patterned features, texture, and the like. Any determined characteristic(s) and possibly any of the images described above may be input to a defect classifier by the computer subsystem. The defect classifier may be configured for determining the classification category (class, type, bin, etc.) of the detected defects based on their determined characteristic(s) and/or one or more of the images. The defect classifier may be any suitable defect classification method or algorithm known in the art. One example of such a defect classifier is a relatively simple decision tree in which different types of defects are separated by applying different cutlines to the defect characteristic(s) that separate different types of defects from each other. Other examples of suitable defect classifiers are machine learning type defect classifiers, some examples of which are described in U.S. Patent Application Publication Nos. 2018/0107928 published Apr. 19, 2018 by Zhang et al. and 2019/0073568 published Mar. 7, 2019 by He et al., which are incorporated by reference as if fully set forth herein. The embodiments described herein may be further configured as described in these publications.

Determining classification categories for the detected defects may also or alternatively include determining the printability of the detected defects on a wafer (or other specimen) if the wafer is printed with the mask in a lithography process. Determining the printability preferably simulates the wafer printing (lithography) process that would be performed using the mask thereby predicting how the defects would affect the patterns printed on the wafer. For example, the computer subsystem may determine whether each detected defect would be critical and cause relatively large errors at wafer print or nuisance and barely observable errors at wafer print. Instead of performing this manually and using human judgment, an automated and substantially accurate way of modeling the EUV lithographic process is provided by the embodiments described herein thereby enabling substantially accurate prediction of the printability of mask absorber defects starting with the detected defect images.

The computer subsystem may input one or more images generated for the detected defects into a model of the lithography process thereby generating simulated wafer images illustrating how the defects affect one or more patterns printed on the wafer in the lithography process. Determining the printability predicts the defect printing impact by wafer exposure condition simulation. This simulation may include mask near-field simulation, which can use either Kirchoff approximation, rigorous finite difference time domain (FDTD) solver, rigorous coupled wave analysis (RCWA), or a compact approximation model such as a Defect Printability Simulator (DPS) mask model (examples of which are described in "Compensation methods using a new model for buried defects in extreme ultraviolet lithography masks," by Clifford et al., Photomask Technology 2010, Proceedings of SPIE Vol. 7823, 78230V, Sep. 24, 2010, 10 pages, which is incorporated by reference as if fully set forth herein), optics, and resist exposure and development models, which may include any suitable such models known in the art. If the wafer process is not fixed yet or a mask near-field model is not well-determined, the printability can be checked on mask binary layout directly without wafer exposure condition simulation for rough estimation. The embodiments described herein may be configured as described in the above-referenced paper. Determining the printability may also be performed as described in U.S. Pat. No. 9,002,497 issued Apr. 7, 2015 to Marella et al. and U.S. Pat. No. 9,478,019 issued Oct. 25, 2016 to Sezginer et al., which are incorporated by reference as if fully set forth herein. The embodiments described herein may be further configured as described in these patents.

In another embodiment, determining classification categories for the detected defects includes determining a printability of the detected defects on a wafer if the wafer is printed with the mask in a lithography process, and determining the printability includes simulating aerial images for the defect images generated for the detected defects and for the corresponding reference images (either or both of the DB and mDie reference images), and determining how the detected defects affect one or more patterns printed on the wafer in the lithography process based on the simulated aerial images. For example, a mask model may be applied to both the test and reference images for a defect with the associated scanner exposure conditions to generate test and reference (EUV or other) aerial images. The mask model may be applied to the images as described further herein. In this manner, the computer subsystem may run printability simulations with scanner optical conditions. The Aerial Image Analyzer (AIA) may then be run to compute printability of all features within the field of view (FOV) of the imaging subsystem in which the defect is located. For example, test and reference aerial images may be input to an AIA that may generate a simulated image showing how the defect would affect the features of the mask in the aerial image projected on a wafer during a lithography process. Examples of the AIA that may be used in the embodiments described herein are described in "Printability and actinic AIMS review of programmed mask blank defects," by Verduijn et al., SPIE Proceedings Vol. 10143, Extreme Ultraviolet (EUV) Lithography VIII, 101430K, Mar. 24, 2017, 13 pages, which is incorporated by reference as if fully set forth herein. The embodiments described herein may be further configured as described in this publication.

The embodiments described herein may also be configured for determining a lithographic significance of the defects detected on the mask as described in U.S. Pat. No. 7,873,204 to Wihl et al. issued Jan. 18, 2011, which is incorporated by reference as if fully set forth herein. The embodiments described herein may be further configured as described in this patent.

In another embodiment, a characteristic of an optical proximity correction (OPC) feature in two or more of the multiple dies is designed to be different for flare correction in a lithography process performed with the mask, and generating the DB reference image includes generating different DB reference images for the two or more of the multiple dies on the mask using the design for the two or more of the multiple dies, respectively. In this additional major new component, a dedicated but optional procedure is provided for the case where flare correction causes noticeable variations in OPC patterns on different dies. Theoretically, once the OPC has a noticeable difference on multiple dies, it is not a typical DD-able inspection region. However, the embodiments described herein provide the ability to handle flare correction. A DB reference image may be generated for each die on the mask as described further herein.

In an additional embodiment, a characteristic of an OPC feature in two or more of the multiple dies is designed to be different for flare correction in a lithography process performed with the mask, and the computer subsystem is configured for determining a sensitivity with which the second defects are detected in the two or more of the multiple dies based on locations of the OPC feature in the two or more of the multiple dies. By comparing the DB from all dies, the computer subsystem can easily detect the flare correction locations, which can be treated as a special defect classification category for usable sensitivity control. Therefore, one advantage of the embodiments described herein is that they provide capability for handling OPC variation caused by flare correction.

One of the patterning distortions that can happen in EUV lithography is flare caused by scattered light in the lithography optics that can cause variations in dimensions of patterns on the wafer from their as-designed dimensions. One way that the flare is handled currently is by flare compensation in the OPC feature(s). For example, the flare may be modeled by inputting information about the lithography process and the mask to appropriate models for the process and mask. The simulated flare information may then be used to modify one or more characteristics of OPC features on the mask with the hope of mitigating (reducing and even eliminating) that flare. Therefore, if different dies contain the same OPC features, they may be modified in different ways to compensate for the flare. For example, an OPC feature in one die may not need to be modified for flare, but the same OPC feature in another die may have to be adjusted (e.g., in size or shape) to reduce the light scattering from the patterned feature to which that OPC feature is applied. Therefore, if images of that OPC feature are compared in DD detection, the DD detection may detect a difference in the images of the OPC feature in different dies and flag that difference as a defect or potential defect even though the difference is caused by an intentional, designed difference between the OPC feature in the different dies. Detection of such non-defects is obviously problematic for a number of reasons and dealing with such detection may cause other problems (e.g., as when sensitivity is reduced to avoid detecting such non-defects, which can cause other defects on the mask to be missed). The embodiments described herein, however, can effectively handle such differences in the design for different dies without any such adverse effects.

In the flare correction flow, the computer subsystem may acquire the DB (design) from all dies, as shown in step 622. In other words, this step may include acquiring the DB (design) for each die. Ideally, the DB design for all dies is the same so that the DB for only one die is acquired for the sake of efficiency and can be used for all dies. However, in some instances, slightly different DB designs may be needed for different dies, which can cause nuisance defect issues for traditional DD inspection as described further above. In other words, slight differences between the designs for different dies can cause corresponding slight differences between the dies formed on the mask. These differences in the design, therefore, although intentional can be erroneously detected as defects.

The design for different dies may then be compared to each other for flare detection, as shown in step 624. In this step, differences between the design (and particularly the design for OPC features) for different dies may indicate differences that were intentionally made in the design to handle flare issues with the mask in the lithography process. Therefore, the differences between the images of the dies that are due to intentional differences in the design made for flare correction may not be defects even though they may be detected as such by a DD defect detection process. Therefore, one way to prevent these design differences from being detected as defects is to identify the locations of the design differences as described above and then to control the defect detection process so that these differences are not detected as defects or to remove any defects detected at these locations from the final defect report. For example, as shown in FIG. 6, the results of flare detection 624 may be input to final defect report 628 to remove any defects detected at locations at which the design is intentionally different in different dies or to filter out any defects detected at such locations that have one or more characteristics (e.g., size) below a predetermined limit. In this manner, the computer subsystem can alter the sensitivity of the inspection by filtering the defects that have been detected by DD detection based on identified flare correction locations.

In some embodiments, the computer subsystem is configured for generating inspection results for the mask including information for the first and second defects. For example, as shown in FIG. 6, the defects detected by systematic error detection step 612 in the DB detection flow and the defects detected by defect detection step 620 in the DD detection flow may both be input to defect classification step 626 and then the results of all three steps (possibly modified by the flare detection flow) may be used to generate final defect report 628. In this manner, the final defect report may include information for both systematic mask writer errors detected by the DB detection flow and defects that are detected by DD detection. The final defect report may include any of the information generated by any of the steps described herein (such as defect ID, defect location, defect classification, etc.). The final defect report may have any suitable file or format known in the art and may be output by the computer subsystem in any suitable manner.

In one embodiment, the images of the mask generated by the imaging subsystem and used for detecting the first defects, generating the die reference image, and detecting the second defects are selected from only images of die equivalent regions of the multiple dies, and the die equivalent regions are smaller than the multiple dies. In one such embodiment, the die equivalent regions have a size in one dimension equal to a width of a swath scanned on the mask by the imaging subsystem. In another such embodiment, the multiple dies include dies formed on the mask in a two-dimensional array.

Figure 7:
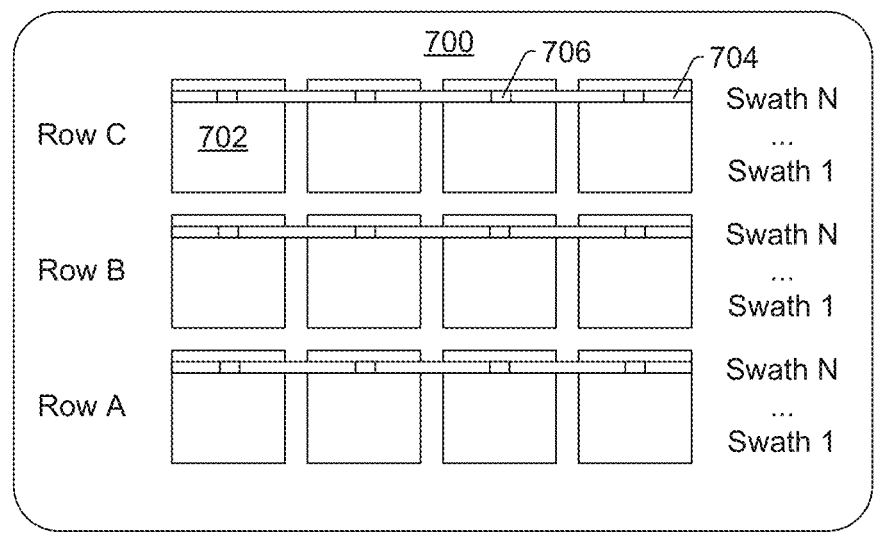
FIG. 7 is a schematic diagram illustrating a plan view of one example of a layout of multiple dies on a mask and swaths scanned on the mask and an embodiment of a die-equivalent region in each of the dies.

In the above-described embodiments, an inspection swath map may be set up to scan die-equivalent regions in order. In this manner, the equivalent swath is scanned for each separate row of dice. For example, as shown in FIG. 7, there are 3 rows of dice 702: Row A, Row B, and Row C formed on mask 700. Each row of dice includes 4 dice, and the rows and columns of dice on the mask form a two-dimensional array of dice on the mask. Although 3 rows and 4 columns of dice are shown in FIG. 7, the masks described herein may include any suitable number of dice arranged in both rows and columns and any suitable number of rows and columns of dice. Multiple swaths, e.g., from Swath 1 to Swath N, may be scanned across each row of dice in order from Row A to Row C or vice versa. Swath 704 that is shown is the Nth swath (Swath N) in each of those rows of dice. The indicated patch 706 is a die-equivalent region that contains exactly the same pattern within each die. As shown in FIG. 7, each die-equivalent region indicated by patch 706 is smaller than each of the dies. In addition, as shown in FIG. 7, each of the die-equivalent regions indicated by patch 706 has a size in one dimension that is equal to a width of Swath N.

This concept of die-equivalent regions may be advantageous for certain steps described herein, and the die-equivalent regions may be used in place of the dies shown in FIG. 6. In other words, the steps described herein performed with respect to dies may be performed in the same manner for die-equivalent regions. In this manner, in any step described herein as being performed for dies, the same functions may be performed for die-equivalent regions. One advantage of the embodiments described herein is therefore that they can use a die-equivalent region setup to cover all kinds of multi-die layout masks. In addition, one new feature of the embodiments described herein is that they can handle all kinds of multi-die layout masks.

All of the embodiments described herein may include storing results of one or more steps of the embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

The computer subsystem may be configured for dispositioning the detected defects based on any of the information generated by the embodiments described herein. "Dispositioning" as that term is used herein is defined as determining additional information for a detected defect that can be used to make a final decision for how to appropriately deal with the detected defect, e.g., that a detected defect should be repaired, that a detected defect is a nuisance and can be ignored, that a detected defect does not need to be repaired but the wafers printed with the mask should be monitored for the detected defect's impact on the wafer patterns formed with the mask, etc.

The computer subsystem may send information for the detected defects to a mask review tool. For example, secondary charged particle beam (e-beam or ion beam) imaging of the mask provides higher resolution than inspection allowing for much better review of detected defects on masks. Therefore, the charged particle beam images can be used to determine information for the detected defects more accurately (with greater resolution) than the inspection images of the detected defects thereby enabling additional information to be determined from the charged particle beam images that can be used to make decisions about (disposition) the detected defects more effectively. Recent advances in multi-beam and multi-column electron beam imaging also allows for massive SEM data collection. In this manner, after the inspection is completed, test SEM images can be captured on a mask review, CD-SEM, or electron beam inspection tool (or ion beam images can be captured using one of the ion beam tools described herein) at each detected defect location (or a selected subset of the detected defect locations) determined from the inspection. Each test charged particle beam image may then be dispositioned from one or more of the following aspects described further herein—defect isolation, classification, and printability.

The computer subsystem or another system or method may use results of any of the steps described herein to control and/or alter a mask repair or cleaning process in which the goal is to remove or repair one or more mask defects to thereby prevent such mask defects from being printed on wafers. In one such example, information for the defects detected on the mask may be used by the computer subsystem described herein, another system (e.g., a mask repair system), or another method (e.g., a mask repair method) to determine where on a mask a repair or cleaning process should be performed. The information for the defects detected on the mask may also be used to determine one or more parameters of such a process such as the area on which the process is to be performed, the length of time that the process is to be performed, which chemicals or gases should be used in the process, etc. The altered mask can then be used to print the dies on the mask on wafers in a lithography process. The altered mask may also be re-inspected using the embodiments described herein at another time after it has been introduced or re-introduced to the lithography process.

In one embodiment, the computer subsystem may be configured for sending any of the results described herein for any of the detected defects to a mask repair tool, and the mask repair tool may use the results for the detected defects in a repair process performed on the mask. In this manner, the defect information can be used in the repair tool when the mask needs to be fixed. In one such example, as shown in FIG. 1, computer subsystem 118 (or any other computer subsystem of the system) may be configured to send the information for the detected defects to mask repair tool 140, which may or may not be part of the system. The mask repair tool may have any suitable configuration known in the art. In addition, the mask repair tool may be a commercially available mask repair tool such as the MeRiT neXT system that is commercially available from Carl Zeiss SBE, LLC, Thornwood, N.Y. The mask repair tool may use the defect information to determine one or more parameters of the repair process such as repair position and area with the aim of repairing the detected defects without altering any correctly formed features proximate the detected defects.

The embodiments described herein have a number of advantages over other methods and systems for mask inspection in addition to the advantages already described herein. For example, lithographically significant defects on masks can have a catastrophic impact on yield, leading to lost time and money for wafer manufacturers and in extreme cases, complete loss of profitability, especially for EUV masks. Before actinic photomask inspection tools for EUV masks are mature, it is critical to push the usable sensitivity of the resolution-limited inspection tool. Combining DD and DB detection flows allows the user to utilize the advantages of both DD and DB detection flows with maximized usable sensitivity. Users will be better equipped to reliably detect the lithographically significant defects on masks with multi-die layouts.

Each of the embodiments of each of the systems described above may be combined together into one single embodiment.

Another embodiment relates to a computer-implemented method for detecting defects on a mask. The method includes generating a DB reference image for a mask having multiple dies formed thereon by simulating a physical version of the mask from a design for the mask and simulating an image of the physical version of the mask generated by an imaging subsystem from the simulated physical version of the mask. The method also includes detecting first defects on the mask by comparing the DB reference image to the images of the mask generated by the imaging subsystem for a first of the multiple dies. In addition, the method includes generating a die reference image for the first of the multiple dies by applying one or more parameters of the imaging subsystem learned by generating the DB reference image to the images generated by the imaging subsystem of one or more of the multiple dies other than the first of the multiple dies. The method further includes detecting second defects on the mask by comparing the die reference image to the images of the mask generated by the imaging subsystem for the first of the multiple dies. Generating the DB reference image, detecting the first defects, generating the die reference image, and detecting the second defects are performed by a computer subsystem coupled to the imaging subsystem.

Each of the steps of the method may be performed as described further herein. The method may also include any other step(s) that can be performed by the imaging subsystem and/or computer subsystem(s) or system(s) described herein, which may be configured according to any of the embodiments described herein. In addition, the method described above may be performed by any of the system embodiments described herein.

Figure 8:
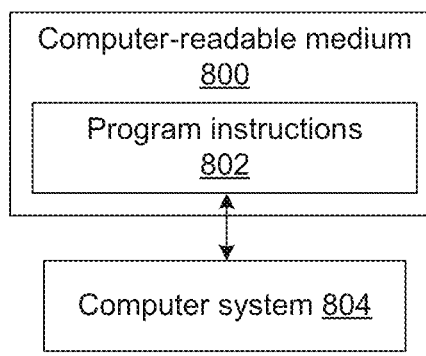
FIG. 8 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for detecting defects on a mask. One such embodiment is shown in FIG. 8. In particular, as shown in FIG. 8, non-transitory computer-readable medium 800 includes program instructions 802 executable on computer system 804. The computer-implemented method may include any step(s) of any method(s) described herein.

Program instructions 802 implementing methods such as those described herein may be stored on computer-readable medium 800. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 804 may be configured according to any of the embodiments described herein.

Further modifications and alternative embodiments of various aspects of the invention will be apparent to those skilled in the art in view of this description. For example, methods and systems for detecting defects on a mask are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured for detecting defects on a mask, comprising:
    an imaging subsystem configured to generate images of a mask having multiple dies formed thereon; and
    a computer subsystem configured for:
        generating a database reference image for the mask by simulating a physical version of the mask from a design for the mask and simulating an image of the physical version of the mask generated by the imaging subsystem from the simulated physical version of the mask;
        detecting first defects on the mask by comparing the database reference image to the images of the mask generated by the imaging subsystem for a first of the multiple dies;
        generating a die reference image for the first of the multiple dies by applying one or more parameters of the imaging subsystem learned by generating the database reference image to the images generated by the imaging subsystem of one or more of the multiple dies other than the first of the multiple dies; and
        detecting second defects on the mask by comparing the die reference image to the images of the mask generated by the imaging subsystem for the first of the multiple dies.

2. The system of claim 1, wherein the mask is configured for use at one or more extreme ultraviolet wavelengths of light.

3. The system of claim 1, wherein the imaging subsystem is further configured to generate the images of the mask by illuminating the mask with light having a wavelength of 193 nm.

4. The system of claim 1, wherein the imaging subsystem is further configured to generate the images of the mask by illuminating the mask with light having one or more wavelengths in a range from 193 nm to 257 nm.

5. The system of claim 1, wherein the imaging subsystem is further configured to generate the images of the mask by illuminating the mask with light having a wavelength of 13.5 nm.

6. The system of claim 1, wherein the imaging subsystem is further configured to generate the images of the mask by illuminating the mask with electrons.

7. The system of claim 1, wherein the imaging subsystem is further configured to generate the images of the mask by illuminating the mask with ions.

8. The system of claim 1, wherein simulating the physical version of the mask comprises nearfield modeling, and wherein simulating the image of the physical version of the mask comprises partial coherent illumination modeling.

9. The system of claim 1, wherein simulating the image of the physical version of the mask comprises calibrating the one or more parameters of the imaging subsystem in a model used for simulating the image of the physical version of the mask for focus and aberration errors in the imaging subsystem.

10. The system of claim 1, wherein the one or more parameters of the imaging subsystem learned by generating the database reference image comprise basis images representing focus and aberration errors in the imaging subsystem, and wherein generating the die reference image comprises synthesizing the die reference image as a linear combination of the images generated by the imaging subsystem of the one or more of the multiple dies other than the first of the multiple dies and the basis images.

11. The system of claim 1, wherein the computer subsystem is further configured for: determining a characteristic of one or more features of the mask in an inspection region of the images of the first of the multiple dies on the mask; and based on the determined characteristic, selecting the database reference image or the die reference image for detecting the second defects in the inspection region.

12. The system of claim 1, wherein the computer subsystem is further configured for acquiring information for one or more patterns closest to the first and second defects on the mask and classifying the first and second defects based on the information for the one or more patterns closest to the first and second defects on the mask, respectively.

13. The system of claim 1, wherein the computer subsystem is further configured for determining classification categories for the first and second defects and assigning scores to the first and second defects based on the determined classification categories, and wherein the scores indicate a severity of the first and second defects for a lithography process performed with the mask.

14. The system of claim 1, wherein the computer subsystem is further configured for generating inspection results for the mask comprising information for the first and second defects.

15. The system of claim 1, wherein a characteristic of an optical proximity correction feature in two or more of the multiple dies is designed to be different for flare correction in a lithography process performed with the mask, and wherein generating the database reference image comprises generating different database reference images for the two or more of the multiple dies on the mask using the design for the two or more of the multiple dies, respectively.

16. The system of claim 1, wherein a characteristics of an optical proximity correction feature in two or more of the multiple dies is designed to be different for flare correction in a lithography process performed with the mask, and wherein the computer subsystem is further configured for determining a sensitivity with which the second defects are detected in the two or more of the multiple dies based on locations of the optical proximity feature in the two or more of the multiple dies.

17. The system of claim 1, wherein the computer subsystem is further configured for generating an additional die reference image for a second of the multiple dies by applying the one or more parameters of the imaging subsystem learned by generating the database reference image to the images generated by the imaging subsystem of one or more of the multiple dies other than the second of the multiple dies, and wherein detecting the second defects on the mask comprises comparing the additional die reference image to the images of the mask generated by the imaging subsystem for the second of the multiple dies.

18. The system of claim 1, wherein the first defects comprise systematic mask writer errors.

19. The system of claim 1, wherein the images of the mask generated by the imaging subsystem and used for detecting the first defects, generating the die reference image, and detecting the second defects are selected from only images of die equivalent regions of the multiple dies, and wherein the die equivalent regions are smaller than the multiple dies.

20. The system of claim 19, wherein the die equivalent regions have a size in one dimension equal to a width of a swath scanned on the mask by the imaging subsystem.

21. The system of claim 19, wherein the multiple dies comprise dies formed on the mask in a two-dimensional array.

22. A non-transitory computer-readable medium, storing program instructions executable on a computer system for performing a computer-implemented method for detecting defects on a mask, wherein the computer-implemented method comprises:
generating a database reference image for a mask having multiple dies formed thereon by simulating a physical version of the mask from a design for the mask and simulating an image of the physical version of the mask generated by an imaging subsystem from the simulated physical version of the mask;
detecting first defects on the mask by comparing the database reference image to the images of the mask generated by the imaging subsystem for a first of the multiple dies;
generating a die reference image for the first of the multiple dies by applying one or more parameters of the imaging subsystem learned by generating the database reference image to the images generated by the imaging subsystem of one or more of the multiple dies other than the first of the multiple dies; and
detecting second defects on the mask by comparing the die reference image to the images of the mask generated by the imaging subsystem for the first of the multiple dies.

23. A computer-implemented method for detecting defects on a mask, comprising:
generating a database reference image for a mask having multiple dies formed thereon by simulating a physical version of the mask from a design for the mask and simulating an image of the physical version of the mask generated by an imaging subsystem from the simulated physical version of the mask;

detecting first defects on the mask by comparing the database reference image to the images of the mask generated by the imaging subsystem for a first of the multiple dies;

generating a die reference image for the first of the multiple dies by applying one or more parameters of the imaging subsystem learned by generating the database reference image to the images generated by the imaging subsystem of one or more of the multiple dies other than the first of the multiple dies; and detecting second defects on the mask by comparing the die reference image to the images of the mask generated by the imaging subsystem for the first of the multiple dies, wherein generating the database reference image, detecting the first defects, generating the die reference image, and detecting the second defects are performed by a computer subsystem coupled to the imaging subsystem.

\* \* \* \* \*